(12) United States Patent
Toh et al.

(10) Patent No.: US 10,211,338 B2
(45) Date of Patent: Feb. 19, 2019

(54) INTEGRATED CIRCUITS HAVING TUNNEL TRANSISTORS AND METHODS FOR FABRICATING THE SAME

(71) Applicant: GLOBALFOUNDRIES Singapore Pte. Ltd., Singapore (SG)

(72) Inventors: Eng Huat Toh, Singapore (SG); Kiok Boone Elgin Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 175 days.

(21) Appl. No.: 14/844,522

(22) Filed: Sep. 3, 2015

(65) Prior Publication Data

US 2017/0069753 A1    Mar. 9, 2017

(51) Int. Cl.
| | |
|---|---|
| *H01L 29/78* | (2006.01) |
| *H01L 29/66* | (2006.01) |
| *H01L 21/283* | (2006.01) |
| *H01L 21/02* | (2006.01) |
| *H01L 29/423* | (2006.01) |
| *H01L 29/08* | (2006.01) |
| *H01L 29/06* | (2006.01) |
| *H01L 29/10* | (2006.01) |
| *H01L 29/36* | (2006.01) |
| *H01L 21/306* | (2006.01) |
| *H01L 29/739* | (2006.01) |

(52) U.S. Cl.
CPC .... *H01L 29/7827* (2013.01); *H01L 21/02636* (2013.01); *H01L 21/283* (2013.01); *H01L 21/30604* (2013.01); *H01L 29/0657* (2013.01); *H01L 29/083* (2013.01); *H01L 29/0847* (2013.01); *H01L 29/1041* (2013.01); *H01L 29/36* (2013.01); *H01L 29/4236* (2013.01); *H01L 29/66356* (2013.01); *H01L 29/66553* (2013.01); *H01L 29/66666* (2013.01); *H01L 29/66977* (2013.01); *H01L 29/7391* (2013.01)

(58) Field of Classification Search
CPC ........ H01L 21/823487; H01L 27/2454; H01L 27/10841; H01L 27/10876; H01L 27/11519; H01L 27/11556; H01L 27/11582; H01L 29/7827; H01L 29/78642; H01L 29/78696; H01L 29/7889; H01L 29/7926
See application file for complete search history.

(56) References Cited

U.S. PATENT DOCUMENTS

| | | | |
|---|---|---|---|
| 8,309,989 B2 | 11/2012 | Luisier et al. | |
| 2003/0227072 A1* | 12/2003 | Forbes | ............ H01L 21/823885 257/616 |
| 2004/0157353 A1* | 8/2004 | Ouyang | ............... H01L 29/1054 438/38 |

(Continued)

*Primary Examiner* — Tom Thomas
*Assistant Examiner* — John Bodnar
(74) *Attorney, Agent, or Firm* — Lorenz & Kopf, LLP

(57) ABSTRACT

Integrated circuits including tunnel transistors and methods for fabricating such integrated circuits are provided. An exemplary method for fabricating an integrated device includes forming a lower source/drain region in and/or over a semiconductor substrate. The method forms a channel region overlying the lower source/drain region. The method also forms an upper source/drain region overlying the channel region. The method includes forming a gate structure beside the channel region.

5 Claims, 12 Drawing Sheets

(56) References Cited

U.S. PATENT DOCUMENTS

| | | | |
|---|---|---|---|
| 2005/0148137 A1* | 7/2005 | Brask | H01L 21/823821 438/216 |
| 2007/0228491 A1* | 10/2007 | Forbes | H01L 29/0657 257/401 |
| 2010/0123170 A1* | 5/2010 | Fujimoto | H01L 21/823487 257/208 |
| 2011/0241122 A1* | 10/2011 | Masuoka | H01L 27/11 257/369 |
| 2011/0253981 A1* | 10/2011 | Rooyackers | B82Y 10/00 257/24 |
| 2014/0048846 A1* | 2/2014 | Lui | H01L 29/8613 257/139 |
| 2014/0054549 A1* | 2/2014 | Loh | H01L 29/66356 257/27 |
| 2014/0291736 A1* | 10/2014 | Goto | H01L 29/78 257/288 |
| 2015/0069458 A1* | 3/2015 | Li | H01L 29/66795 257/105 |
| 2015/0318213 A1* | 11/2015 | Tsai | H01L 21/823462 257/9 |
| 2015/0333078 A1* | 11/2015 | Colinge | H01L 21/28282 257/316 |

* cited by examiner

INTEGRATED CIRCUITS HAVING TUNNEL TRANSISTORS AND METHODS FOR FABRICATING THE SAME

TECHNICAL FIELD

The technical field generally relates to integrated circuits and methods for fabricating integrated circuits, and more particularly relates to integrated circuits having tunnel transistors and methods for fabricating integrated circuits having tunnel transistors.

BACKGROUND

Transistors consume power in two distinct ways: (1) during an OFF state (i.e., standby), when a leakage current flows through the transistor, even though it is not needed, and (2) during an ON/OFF switching operation, when surrounding circuits are charged and discharged due to a voltage change on the transistor that changes the transistor state between OFF and ON. To reduce power consumption, it is desirable to reduce both the leakage current present during the OFF state and the voltage swing used for the ON/OFF switching operation as much as possible. The ON/OFF voltage swing may be characterized by the sub-threshold slope ("SS"), also sometimes referred to as the subthreshold swing. Conventional metal-oxide-silicon field-effect transistors ("MOSFETs") are fundamentally limited to a lower bound SS of 60 mV/decade (at room temperature) that cannot be reduced.

Tunnel field-effect transistors ("TFETs") or tunnel transistors have been designed to reduce the SS beyond this limit and, thereby, to allow further reductions in the ON/OFF voltage swing. In tunnel transistors, the cold injection of valence electrons located in a source contact into the conduction band of a drain contact (or vice versa) does not impose any theoretical lower limit to the SS. Most tunnel transistor designs, however, are based on lateral tunneling and suffer from relatively low ON currents, due to a small available tunneling area. More recently, tunnel transistors using a vertical band-to-band tunneling ("BTBT") approach, similar to the gate induced drain leakage ("GIDL") mechanism present in conventional MOSFETs, have been proposed. The vertical BTBT approach has the advantage of providing a large tunneling area, proportional to the gate length of the transistor, that should provide large ON currents. Thus, the vertical BTBT approach offers potential power savings as compared to conventional designs.

Nevertheless, proposed tunnel transistor designs face shortcomings Accordingly, it is desirable to provide methods for fabricating improved integrated circuits having tunnel transistors. Further, it is desirable to provide improved methods for fabricating integrated circuits having tunnel transistors. Furthermore, other desirable features and characteristics will become apparent from the subsequent detailed description and the appended claims, taken in conjunction with the accompanying drawings and this background.

BRIEF SUMMARY

Integrated circuits including tunnel transistors and methods for fabricating such integrated circuits are provided. An exemplary method for fabricating an integrated device includes forming a lower source/drain region in and/or over a semiconductor substrate. The method forms a channel region overlying the lower source/drain region. The method also forms an upper source/drain region overlying the channel region. The method includes forming a gate structure beside the channel region.

In another embodiment, a method for fabricating an integrated circuit includes etching a semiconductor material to form a fin structure having a vertical side surface and to form an exposed horizontal surface of the semiconductor material adjacent the vertical side surface of the fin structure. The method includes epitaxially growing a pocket region of semiconductor material on the vertical side surface of the fin structure and on the exposed horizontal surface of the semiconductor material. Further, the method includes forming a gate structure adjacent the pocket region. A tunnel transistor is formed by the fin structure, the pocket region and the gate structure.

In yet another embodiment, an integrated circuit is provided. The integrated circuit includes a semiconductor substrate and a tunnel transistor. The tunnel transistor includes a lower source/drain region in and/or over the semiconductor substrate, a channel region overlying the lower source/drain region, an upper source/drain region overlying the channel region, a pocket region overlying the lower source/drain region and beside the channel region, and a gate structure adjacent the pocket region.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
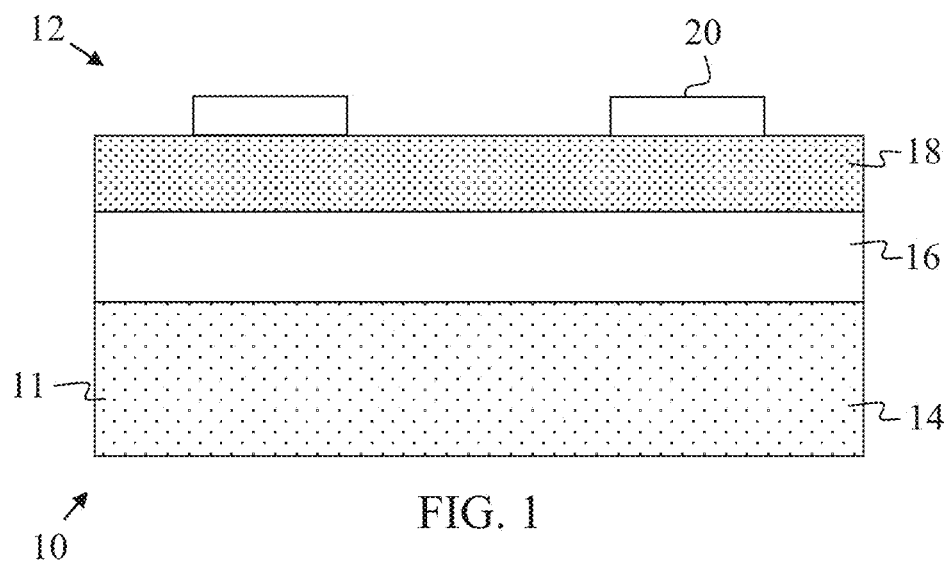
FIGS. 1-22 illustrate, in cross section, exemplary methods for fabricating integrated circuits having tunnel transistors in accordance with embodiments.

The following detailed description is merely exemplary in nature and is not intended to limit the integrated circuits having tunnel transistors or the methods for fabricating integrated circuits having tunnel transistors. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and processes described herein may be incorporated into a more comprehensive procedure or process having additional processes or functionality not described in detail herein. In particular, various processes in semiconductor processing and the fabrication of integrated circuits are well-known and so, in the interest of brevity, many conventional processes will only be mentioned briefly herein or will be omitted entirely without providing the well-known process details. Further, it is noted that integrated circuits include a varying number of components and that single components shown in the illustrations may be representative of multiple components. Also, details of the description provided herein provide for formation of an NFET device. Accordingly, a PFET device may be formed using an opposite doping configuration.

As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. When an element or layer is referred to as being "beside" another element or layer, it is at a same height along a horizontal plane with the other element or layer. Further, spatially relative terms, such as "vertical", "horizontal", "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

As described herein, a method is provided for forming an integrated circuit having a tunnel transistor. In an exemplary embodiment, the tunnel transistor is formed with vertically aligned source/drain regions. Further, the exemplary tunnel transistor is formed with a gate structure beside the channel region and a portion of a source/drain region and overlying another portion of the source/drain region. As formed, the tunnel transistor provides for higher ON state current and achieves improved subthreshold swing with uniform gate control over a larger tunneling area as compared with known devices. Further, the tunnel transistor described herein allows for lower OFF state leakage, resulting in lower power consumption, as compared to known devices. In an exemplary embodiment, the channel region and source/drain regions as vertically aligned, thereby reducing their required chip size or footprint.

Figure 3:
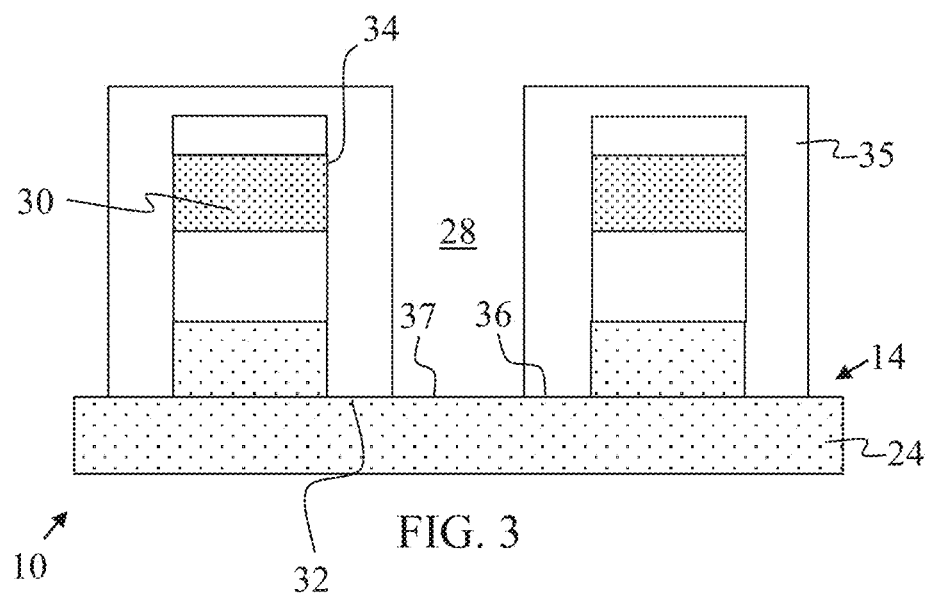
Figure 4:
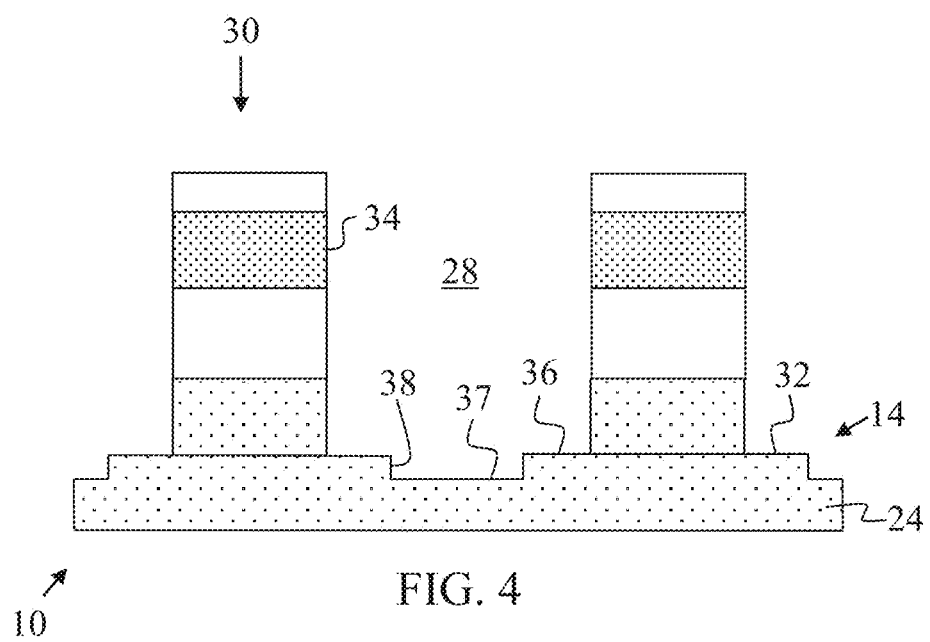
Figure 5:
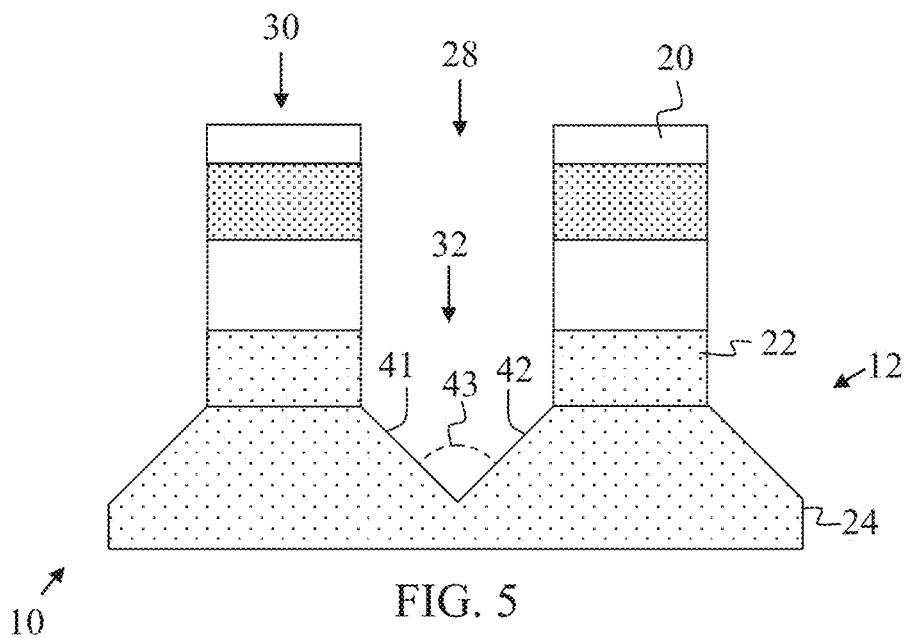
Figure 23:
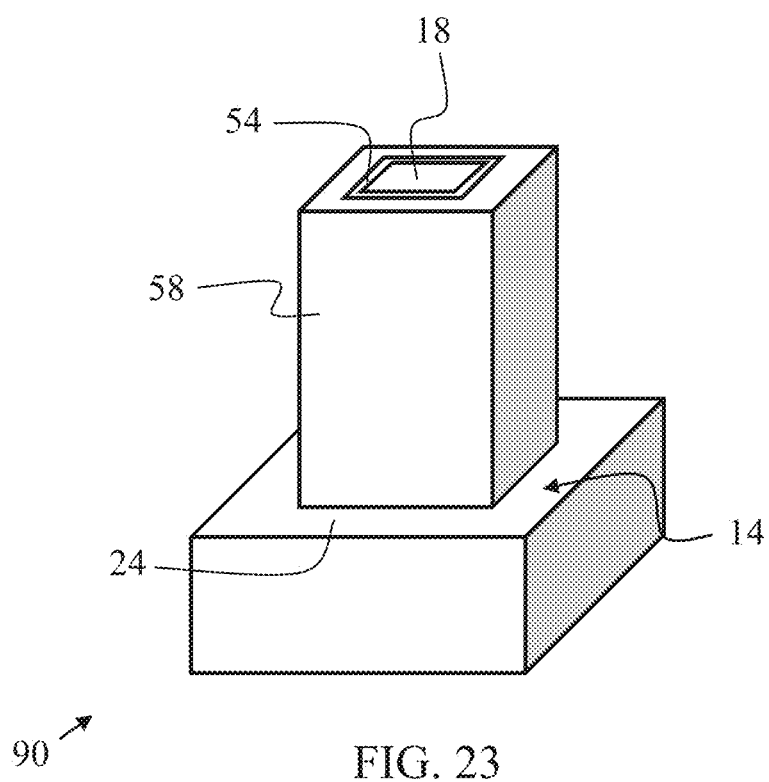
FIGS. 23-24 provide perspective views of exemplary tunnel transistors to aid in the interpretation of the cross section views of FIGS. 1-22.
Figure 24:
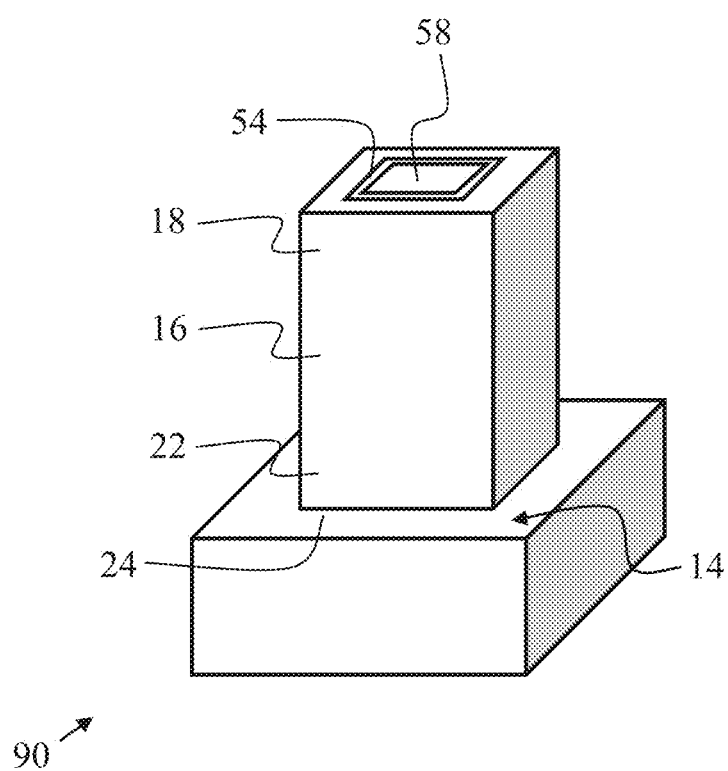

FIGS. 1-22 illustrate exemplary methods for fabricating integrated circuits having tunnel transistors. In FIGS. 1-9, exemplary processes for the formation of an integrated circuit according to a "drain first" method are illustrated. FIGS. 3-4 and 5 illustrate optional processes for forming lower portions of source/drain regions with non-planar upper surfaces. In FIGS. 10-15, exemplary processes for the formation of an integrated circuit according to a "drain last" method are illustrated. In FIG. 16-22, exemplary processes for a "drain last" method that avoids use of the optional pocket region are illustrated. FIGS. 23-24 provide perspective views of exemplary tunnel transistors to aid in the interpretation of the cross section views of FIGS. 1-22.

In FIG. 23, an exemplary tunnel transistor 90 is illustrated. The tunnel transistor 90 includes a cylindrical gate insulator layer 54 and a cylindrical gate structure 58 formed around a vertical alignment of a source region 14, channel region (not shown), and drain region 18. The cylindrical gate insulator layer 54 and cylindrical gate structure 58 surround an upper portion (not shown) of the source region 14 and lie over a lower portion 24 of the source region 14. As a result, a horizontal interface is formed between the lower portion 24 of the source region 14 and the gate insulator 54/gate structure 58 and a vertical interface is formed between the upper portion of the source region 14 and the gate insulator 54/gate structure 58. Thus, horizontal and vertical tunneling paths are provided in the tunnel transistor 90. This structure provides for increased band-to-band tunneling ("BTBT") area.

FIG. 24 illustrates a tunnel transistor 90 having an opposite configuration. Specifically, in FIG. 24, the tunnel transistor 90 includes a cylindrical vertical alignment of a source region 14, channel region 16, and drain region 18 formed around a gate insulator layer 54 and gate structure 58. A cylindrical upper portion 22 of the source region 14 surrounds the gate insulator 54 and gate structure 58 while the gate insulator 54 and gate structure 58 lie over a lower portion 24 of the source region 14. As a result, a horizontal interface is formed between the lower portion 24 of the source region 14 and the gate insulator 54/gate structure 58 and a vertical interface is formed between the upper portion 22 of the source region 14 and the gate insulator 54/gate structure 58. Thus, horizontal and vertical tunneling paths are provided in the tunnel transistor 90. Again, this structure provides for increased band-to-band tunneling ("BTBT") area.

An embodiment of a method for fabricating an integrated circuit having a tunnel transistor is illustrated in FIGS. 1-9. In FIG. 1, a partially fabricated integrated circuit 10 includes a semiconductor substrate 11 that is provided and processed. It is to be appreciated that various fabrication techniques may be conducted in accordance with the methods described herein to form the semiconductor substrate 11 as shown. Herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor substrate 11 may include a compound semiconductor such as silicon carbide, silicon germanide, gallium arsenide, indium arsenide, indium gallium arsenide, indium gallium arsenide phosphide, or indium phosphide and combinations thereof. In an exemplary embodiment, the semiconductor material is a silicon substrate. As referred to herein, a material that includes a recited element/compound includes the recited element/compound in an amount of at least 25 weight percent based on the total weight of the material unless otherwise indicated.

An exemplary semiconductor substrate 11 is a bulk silicon wafer. In other embodiments, the semiconductor substrate 11 may be a semiconductor layer overlying an insulation layer (not shown), such as in a semiconductor-on-insulator wafer. An exemplary semiconductor substrate 11 has a thickness of from about 250 to about 1000 microns, such as from about 400 to about 600 microns.

In FIG. 1, various processes have been performed on the semiconductor substrate 11. For example, isolation regions (not shown) may be formed in the semiconductor substrate 11 to define active regions 12 therein. Also, doping processes may be performed to form a lower source/drain region, such as source region 14, a channel region 16 overlying the source region 14, and an upper source/drain region, such as drain region 18, overlying the channel region 16.

The doping processes may be performed using appropriately chosen impurities depending on the particular semiconductor material employed in semiconductor substrate 11. The regions of the semiconductor substrate 11 may be selectively doped with donor or acceptor atoms to create n-type and p-type regions, respectively. Doping may be performed by implantation and/or in situ epitaxial processes. In an exemplary embodiment, the source region 14 and the drain region 18 are doped by different dopant types. In an embodiment, the source region 14 is a highly doped P+ region and the drain region 18 is a highly doped N+ region. In an exemplary embodiment, the channel region 16 is lightly doped with the same dopant as the source region 14.

In FIG. 1, a hard mask 20 has been formed and patterned over the semiconductor substrate 11. For example, a hard mask material, such as silicon nitride, may be deposited on drain region 18, and patterned according to conventional processes. As shown, the hard mask 20 selectively covers and exposes regions of the semiconductor substrate 11.

Figure 2:
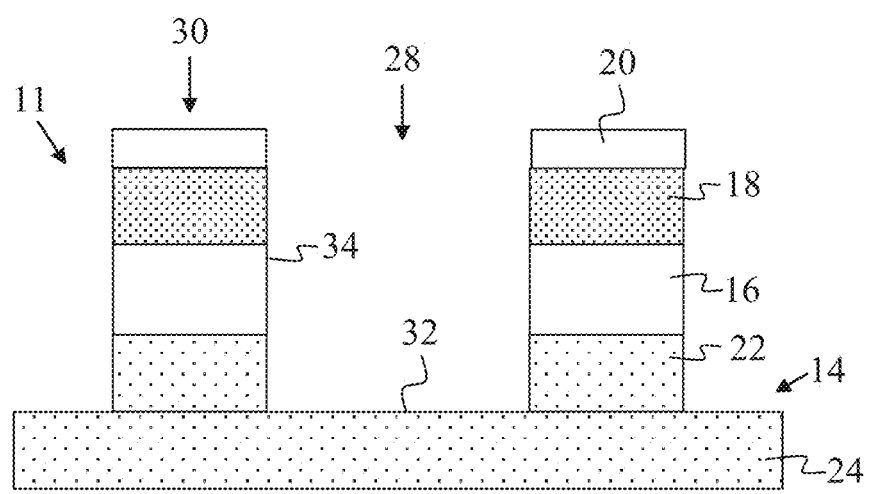

In FIG. 2, an etch process is performed to etch the regions of the semiconductor substrate 11 exposed by the hard mask 20. The exemplary etch is anisotropic and may be a reactive ion etch (RIE). In an embodiment for forming finFETs, the etch process may be a conventional fin etch process. Alternatively, the etch may be used to define vertically aligned source, channel and drain regions for an integrated circuit 10 having planar devices.

In either case, the exemplary etch process etches the semiconductor substrate 11 through the drain region 18, through the channel region 16, and through an upper portion 22 of source region 14. The etch stops on, and defines, a lower portion 24 of source region 14. As shown, the etch forms trenches 28 between vertical semiconductor stacks 30. Each trench 28 is bounded by an upper surface 32 of the lower portion 24 of source region 14 and by side surfaces 34 formed by the upper portion 22 of source region 14, the channel region 16 and the drain region 18. Each vertical semiconductor stack 30 is formed by the drain region 18, the channel region 16 and the upper portion 22 of source region 14.

The method may continue as shown in FIGS. 3-4 or FIG. 5 with optional processing of the upper surface 32 of the lower portion 24 of the source region 14 to increase the surface area of the upper surface 32. As shown in FIG. 3, a spacer 35 may be formed around each vertical semiconductor stack 30. For example, a spacer material, such as silicon oxide, may be deposited over the vertical semiconductor stacks 30 and the upper surface 32 of the lower portion 24 of the source region 14. The spacer material may then be etched to form the spacers 35 according to conventional processes. The spacers 35 define areas 36 of the upper surface 32 of the lower portion 24 of the source region 14 that are masked or covered and areas 37 of the upper surface 32 of the lower portion 24 of the source region 14 that are unmasked or exposed.

In FIG. 4, an etch process is performed. An exemplary etch process is anisotropic, such as an RIE process. The exposed areas 37 of the lower portion 24 of the source region 14 are recessed while the spacers protect the covered areas 36. Then, the spacers 35 (shown in FIG. 3) are removed, such as by an oxide clean process. As shown, in FIG. 4, the etch process provides a stepped upper surface 32 of the lower portion 24 of the source region 14 with a recessed horizontal surface at areas 37, a non-recessed horizontal surface at areas 36, and a vertical portion 38 interconnecting areas 36 and 37. As a result, the surface area of the stepped upper surface 32 is increased as compared to the formerly planar upper surface 32.

FIG. 5 illustrates an alternate process for increasing the surface area of the upper surface 32 of the lower portion 24 of the source region 14. In FIG. 5, an etch process is performed on the structure of the partially fabricated integrated circuit of FIG. 2. Alternatively, the etch process may be performed on the structure of the partially fabricated integrated circuit of FIG. 1. An exemplary etch process used in FIG. 5 is a wet etch using an etchant that exhibits different etch rates for different crystalline planes of the material forming the source region 12. As a result, the lower portion 24 of the source region 14 is etched to a first angled surface 41 and a second angled surface 42 transverse to the first angled surface 41. Exemplary surfaces 41 and 42 form a surface angle 43 of less than about 120 degrees, and/or greater than about 60 degrees, such as about 90 degrees. Together, the first angled surface 41 and the second angled surface 42 form the upper surface 32 of the lower portion 24 of the source region 14.

Figure 6:
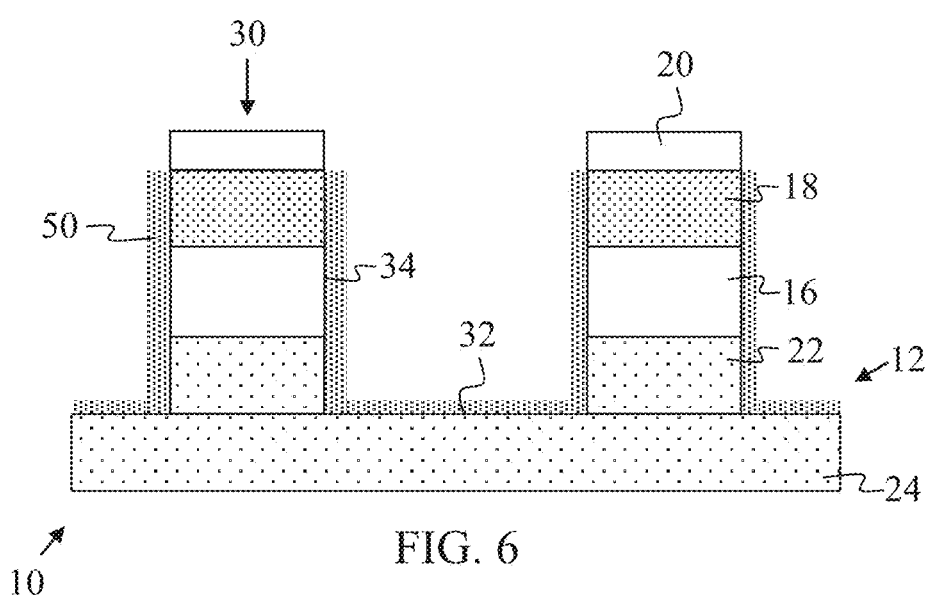

While FIG. 6 illustrates processing of the structure of the partially fabricated integrated circuit 10 shown in FIG. 2, the method may continue in FIG. 6 using the structure of the partially fabricated integrated circuit 10 shown in FIG. 2, 4 or 5. In FIG. 6, an optional pocket region 50 is formed along the upper surface 32 of the lower portion 24 of the source region 12 and along the sidewalls 34 of the vertical semiconductor stacks 30. In an exemplary embodiment, the pocket region 50 is selectively deposited by an epitaxial process. The exemplary pocket region 50 is not formed on the hard mask 20. An exemplary pocket region 50 is doped with same dopant as the drain region 18. In one embodiment, the drain region 18 and pocket region 50 are N+ regions and the source region 14 and channel region 16 are P+ regions. An exemplary pocket region 50 is epitaxially grown, such as n- or p-doped crystalline silicon or silicon germanium. An exemplary pocket region 50 has a thickness of from about 2 to about 10 nm.

Figure 7:
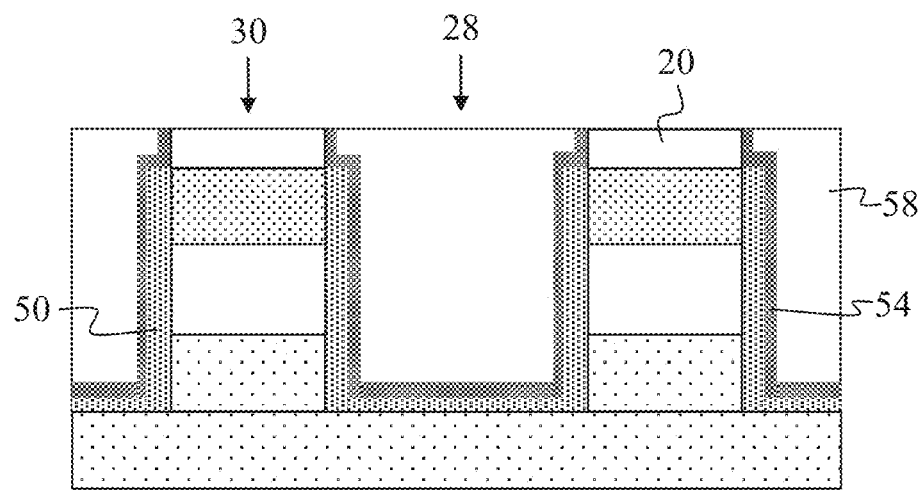

In FIG. 7, a gate insulator layer 54 is formed over the pocket region 50 and the hard mask 20. An exemplary gate insulator layer 54 is a high-k dielectric material, such as $HfO_2$, HfSiON, or another suitable high-k dielectric material. In an exemplary embodiment, the material forming the gate insulator layer 54 is deposited by chemical vapor deposition (CVD). As shown in FIG. 7, a gate structure 58 is formed over the gate insulator layer 54. The material for forming the gate structure 58 may be metal, polycrystalline silicon, amorphous silicon, amorphous carbon, or another suitable material. In an exemplary embodiment, the material for forming the gate structure 58 is metal such as tantalum nitride, titanium nitride or other suitable metal gate material. The gate structure 58 may include a layer or layers of material used to tune the work function of the gate structure 58. Such layers are typically formed between the gate insulator layer 54 and the metal gate, e.g., the TaN or TiN. The materials for forming the gate structure 58 may be deposited over the gate insulator layer 54 by CVD, plasma enhanced chemical vapor deposition (PECVD), physical vapor deposition (PVD), or another suitable process. As shown in FIG. 7, the materials for forming the gate structure 58 and the gate insulator layer 54 may be planarized, such as by chemical mechanical planarization (CMP) to the hard mask 20.

Figure 8:
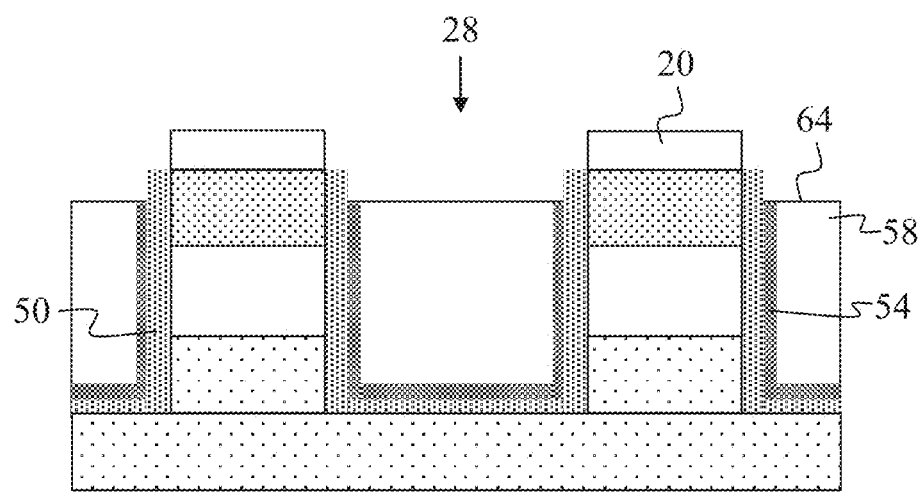

The method may continue in FIG. 8 with a process for recessing the gate structure 58 and the gate insulator 54 within the trench 28. For example, a selective etch process may be used to recess the gate structure 58 and the gate insulator 54 to a recessed surface 64. As shown, the etch process is selective to etching the gate structure 58 and the gate insulator 54 over the pocket region 50 or hard mask 20, which remain substantially unetched. An exemplary embodiment utilizes a process including a combination of dry and wet etching.

Figure 9:
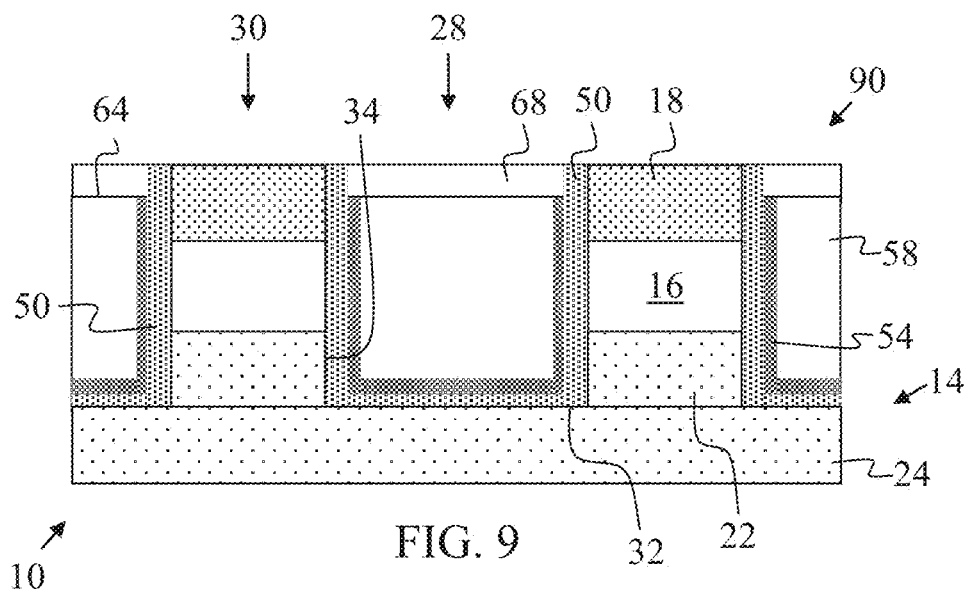

In FIG. 9, a dielectric material 68 is deposited over the recessed surface 64 of the gate structure 58 and the gate insulator 54 and fills the trench 28. As exemplary dielectric material is silicon oxide. In an exemplary embodiment, the dielectric material 68 is blanket deposited by CVD. Then, the partially fabricated integrated circuit 10 is planarized, such as by CMP, to remove portions of the dielectric material 68 outside of the trench 28 and portions of the hard mask 20. The hard mask 20 may be fully removed by a selective wet etch. As a result, the drain region 18 and pocket region 50 exposed.

FIGS. 1-9 provide a partially fabricated integrated circuit 10 with a gate structure 58 formed beside a vertically aligned source region 14, channel region 16, and drain region 18. In the illustrated method a pocket region 50 is formed between the gate structure 58 and the vertically aligned source region 14, channel region 16, and drain region 18. Further, a horizontal interface is formed at surface 32 between the lower portion 24 of the source region 14 and the gate structure 58 (through pocket region 50) and a vertical interface is formed at surface 34 between the upper portion 22 of the source region 14 and the gate structure 58 (through pocket region 50). As a result, horizontal and vertical tunneling paths are provided in the partially fabricated integrated circuit 10 of FIG. 9.

Figure 10:
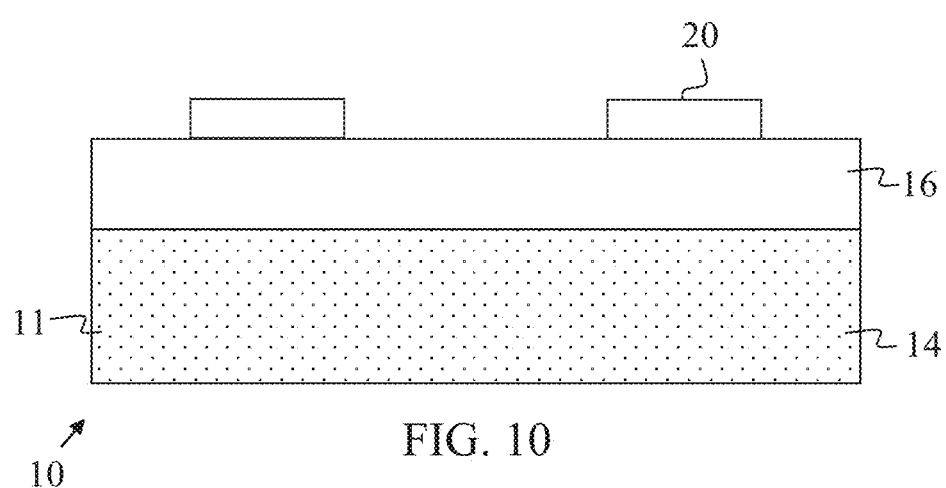

While FIGS. 1-9 formed the drain region 18 before the gate structure 58 in a "drain first" process, FIGS. 10-15 provide for formation of the gate structure 58 before the drain region 18 in "drain last" process. In FIG. 10, the semiconductor substrate 11 is provided with a lower source/drain region, such as lower source region 14, and a channel region 16, and without an upper drain region. The source region 14 and channel region 16 may be formed as described above in relation to FIG. 1. As shown in FIG. 10, a hard mask 20 is formed and patterned over the semiconductor substrate 11. For example, a hard mask material, such as silicon nitride, may be deposited on channel region 16, and patterned according to conventional processes. As shown, the hard mask 20 selectively covers and exposes regions of the semiconductor substrate 11.

Figure 11:
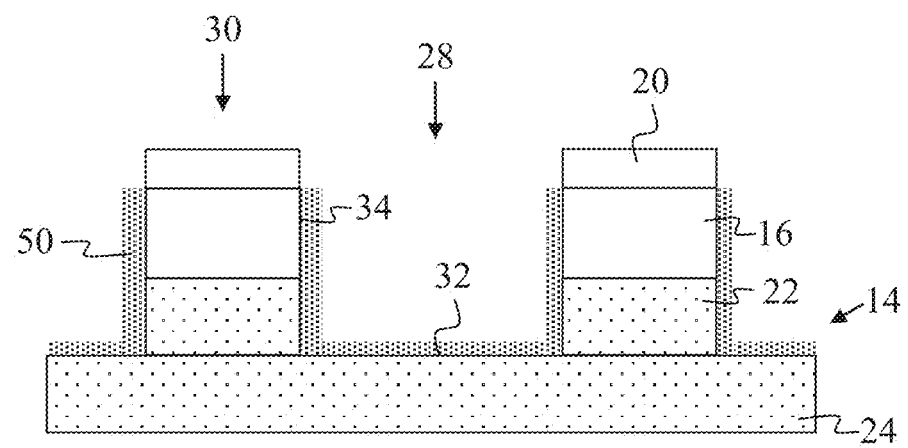

In FIG. 11, an etch process is performed to etch the regions of the semiconductor substrate 11 exposed by the hard mask 20. The exemplary etch is anisotropic and may be a reactive ion etch (RIE). In an embodiment for forming finFETs, the etch process may be a conventional fin etch process. Alternatively, the etch may be used to define vertically aligned source and channel regions for an integrated circuit 10 having planar devices.

In either case, the exemplary etch process etches the semiconductor substrate 11 through the channel region 16 and through an upper portion 22 of source region 14. The etch stops on, and defines, a lower portion 24 of source region 14. As shown, the etch forms trenches 28 between vertical semiconductor stacks 30. Each trench 28 is bounded by an upper surface 32 of the lower portion 24 of source region 14 and by side surfaces 34 formed by the upper portion 22 of source region 14 and the channel region 16. Each vertical semiconductor stack 30 is formed by the channel region 16 and the upper portion 22 of source region 14.

Figure 12:
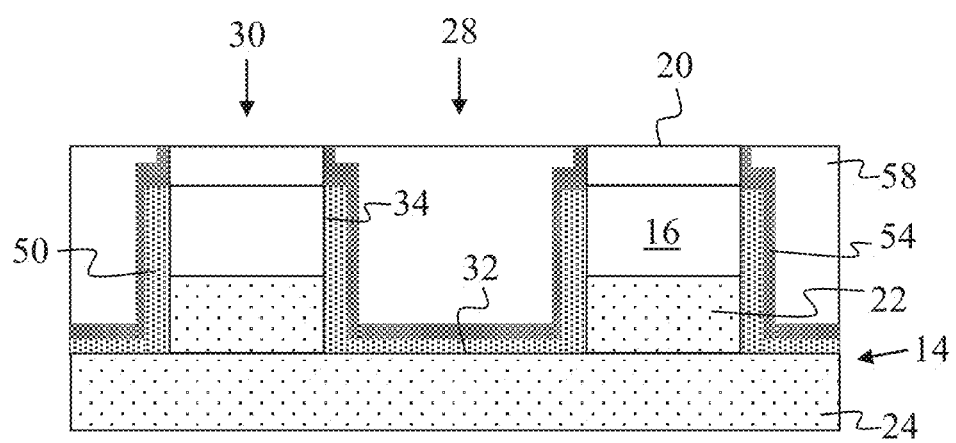

While FIG. 12 processes the partially fabricated integrated circuit 10 of FIG. 11, additional processing may be performed to increase the surface area of the upper surface 32 of the lower portion 24 of source region 14 as described in relation to FIGS. 3-4 and 5 above. In FIG. 12, an optional pocket region 50 is formed along the upper surface 32 of the lower portion 24 of the source region 12 and along the sidewalls 34 of the vertical semiconductor stacks 30. In an exemplary embodiment, the pocket region 50 is selectively deposited by an epitaxial process. The exemplary pocket region 50 is not formed on the hard mask 20. An exemplary pocket region 50 is doped with opposite dopant as the source region 14. In one embodiment, the drain region 18 and pocket region 50 are N+ regions and the source region 14 and channel region 16 are P+ regions. An exemplary pocket region 50 is epitaxially grown, such as n- or p-doped crystalline silicon or silicon germanium. An exemplary pocket region 50 has a thickness of from about 2 to about 10 nm.

In FIG. 12, a gate insulator layer 54 is formed over the pocket region 50 and the hard mask 20. An exemplary gate insulator layer 54 is a high-k dielectric material, such as $HfO_2$, HfSiON, or another suitable high-k dielectric material. In an exemplary embodiment, the material forming the gate insulator layer 54 is deposited by chemical vapor deposition (CVD). As shown in FIG. 12, a gate structure 58 is formed over the gate insulator layer 54. The material for forming the gate structure 58 may be metal, polycrystalline silicon, amorphous silicon, amorphous carbon, or another suitable material. In an exemplary embodiment, the material for forming the gate structure 58 is metal such as tantalum nitride, titanium nitride or other suitable metal gate material. The gate structure 58 may include a layer or layers of material used to tune the work function of the gate structure 58. Such layers are typically formed between the gate insulator layer 54 and the metal gate, e.g., the TaN or TiN. The materials for forming the gate structure 58 may be deposited over the gate insulator layer 54 by CVD, plasma enhanced chemical vapor deposition (PECVD), physical vapor deposition (PVD), or another suitable process. As shown in FIG. 12, the materials for forming the gate structure 58 and the gate insulator layer 54 may be planarized, such as by chemical mechanical planarization (CMP) to the hard mask 20.

Figure 13:
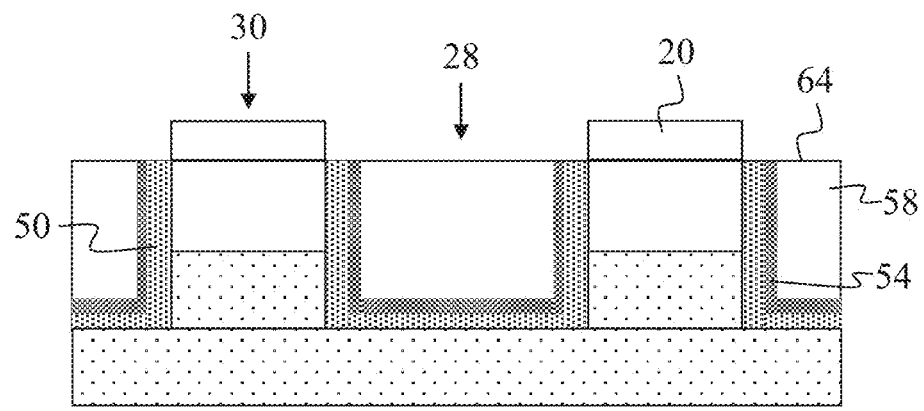

The method may continue in FIG. 13 with a process for recessing the gate structure 58 and the gate insulator 54 within the trench 28. For example, a selective wet etch process may be used to recess the gate structure 58 and the gate insulator 54 to a recessed surface 64. As shown, the etch process is selective to etching the gate structure 58 and the gate insulator 54 over the pocket region 50 or hard mask 20, which remain substantially unetched.

Figure 14:
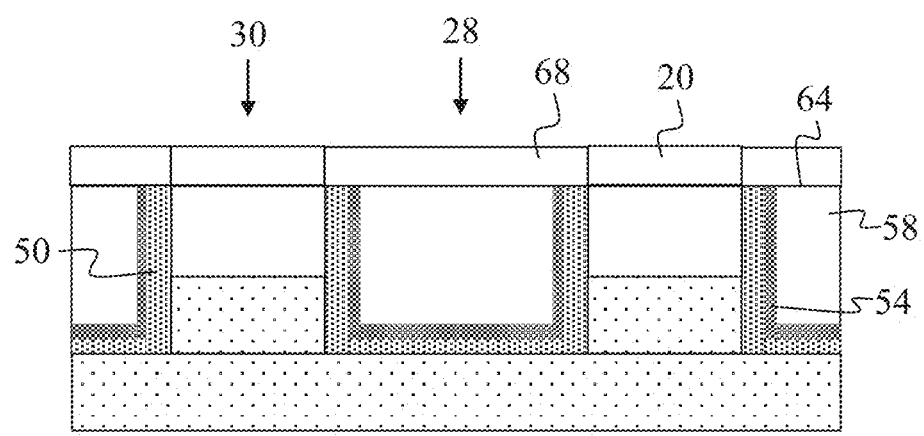

In FIG. 14, a dielectric material 68 is deposited over the recessed surface 64 of the gate structure 58 and the gate insulator 54 and fills the trench 28. As exemplary dielectric material is silicon oxide. In an exemplary embodiment, the dielectric material 68 is blanket deposited by CVD. Then, the partially fabricated integrated circuit 10 is planarized, such as by CMP, to remove portions of the dielectric material 68 outside of the trench 28.

Figure 15:
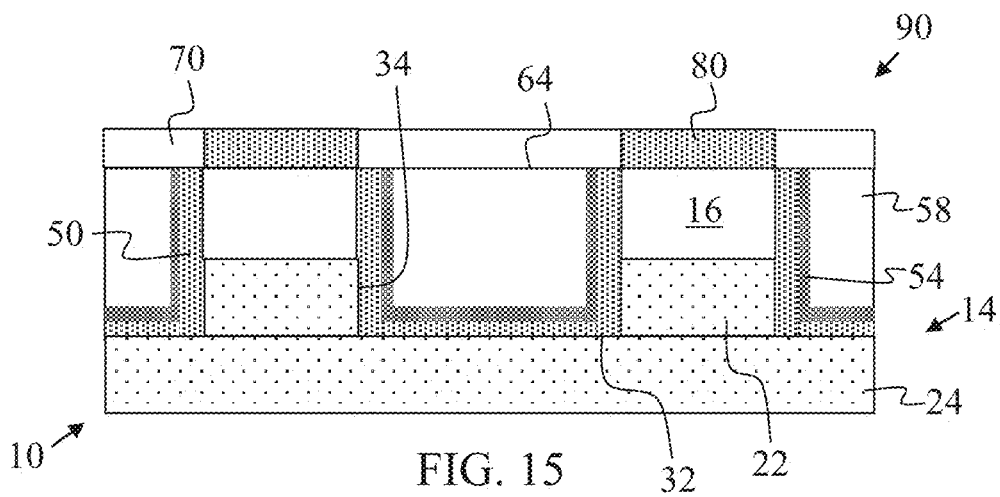

As shown in FIG. 15, the hard mask 20 is removed from the vertical semiconductor stack 30 and the channel region 16 is exposed. In an exemplary embodiment, the hard mask 20 is removed by a dry etch process. Then, an upper source/drain region 80 (or drain region 80) is formed on the channel region 16. An exemplary drain region 80 is a highly doped N+ region. In an exemplary embodiment, the drain region 80 is formed by an in situ epitaxial deposition process.

FIGS. 10-15 provide a partially fabricated integrated circuit 10 with a gate structure 58 formed beside a vertically aligned source region 14 and channel region 16. The drain region 80 lies above the channel region 16, but the gate structure 58 is not formed beside the drain region 80. In the illustrated method a pocket region 50 is formed between the gate structure 58 and the vertically aligned source region 14 and channel region 16. Further, a horizontal interface is formed at surface 32 between the lower portion 24 of the source region 14 and the gate structure 58 (through pocket region 50) and a vertical interface is formed at surface 34 between the upper portion 22 of the source region 14 and the gate structure 58 (through pocket region 50). As a result, horizontal and vertical tunneling paths are provided in the partially fabricated integrated circuit 10 of FIG. 15.

Figure 16:
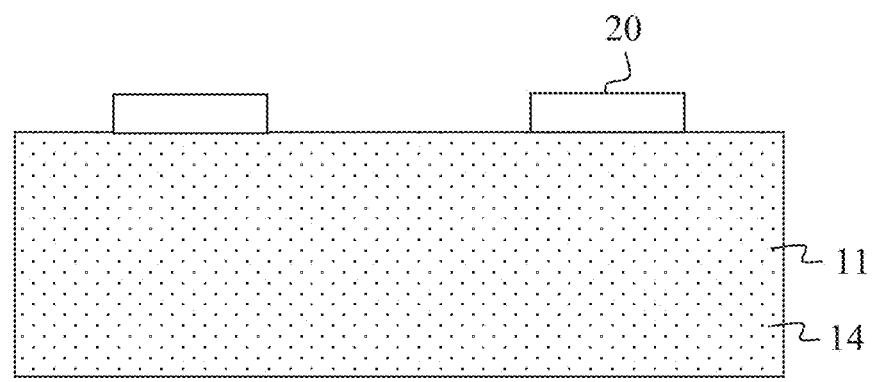

While FIGS. 10-15 utilized the pocket region 50 between the gate structure 58 and source region 14, the embodiment in FIG. 16-22 avoids use of the optional pocket region. In FIG. 16, the semiconductor substrate 11 is provided with a lower source/drain region 14 (hereinafter referred to as source region 14) and without a channel region 16 or an upper source/drain region (hereinafter referred to as drain region). The source region 14 may be formed as described above in relation to FIG. 1. As shown in FIG. 16, a hard mask 20 is formed and patterned over the semiconductor substrate 11. For example, a hard mask material, such as silicon nitride, may be deposited on source region 14, and patterned according to conventional processes. As shown, the hard mask 20 selectively covers and exposes regions of the semiconductor substrate 11.

Figure 17:
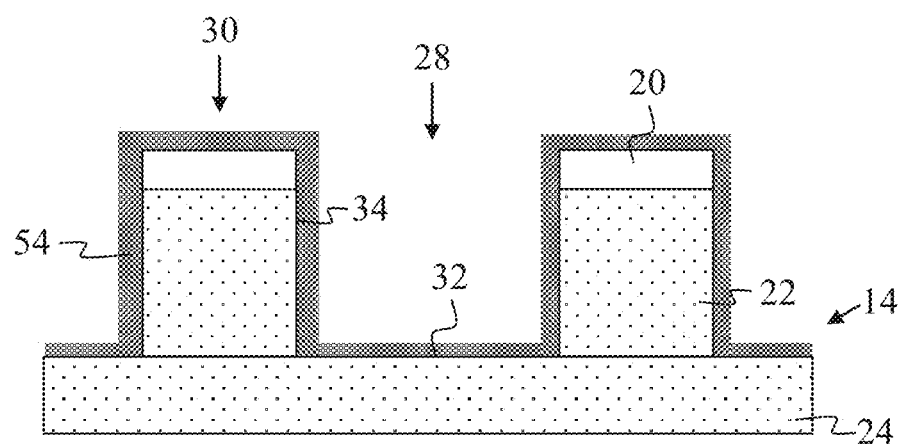

In FIG. 17, an etch process is performed to etch the regions of the semiconductor substrate 11 exposed by the hard mask 20. The exemplary etch is anisotropic and may be a reactive ion etch (RIE). In an embodiment for forming finFETs, the etch process may be a conventional fin etch process. Alternatively, the etch may be used to define source regions for an integrated circuit 10 having planar devices.

In either case, the exemplary etch process etches the semiconductor substrate 11 an upper portion 22 of source region 14. The etch stops on, and defines, a lower portion 24 of source region 14. As shown, the etch forms trenches 28 between vertical semiconductor stacks 30. Each trench 28 is bounded by an upper surface 32 of the lower portion 24 of source region 14 and by side surfaces 34 formed by the upper portion 22 of source region 14. Each vertical semiconductor stack 30 is formed by the upper portion 22 of source region 14.

Figure 18:
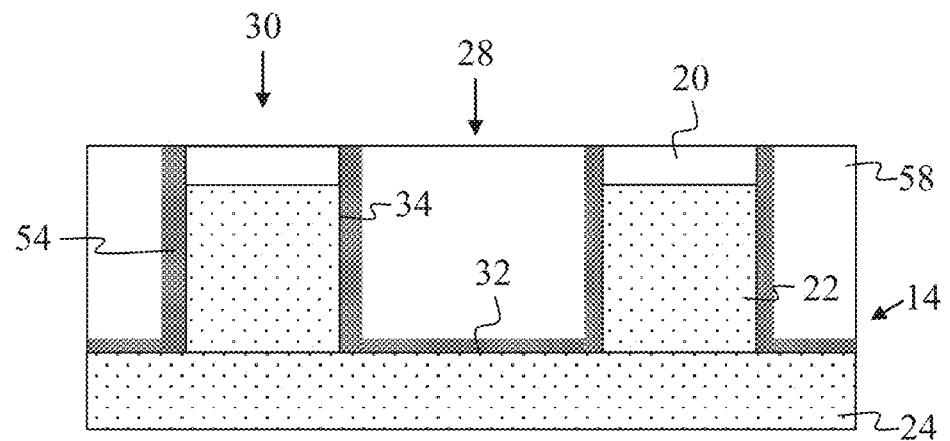

While FIG. 18 processes the partially fabricated integrated circuit 10 of FIG. 17, additional processing may be performed to increase the surface area of the upper surface 32 of the lower portion 24 of source region 14 as described in relation to FIGS. 3-4 and 5 above. In FIG. 18, no pocket region is formed along the upper surface 32 of the lower portion 24 of the source region 12 and along the sidewalls 34 of the vertical semiconductor stacks 30. Rather, a gate insulator layer 54 is formed on the upper surface 32 of the lower portion 24 of the source region 12 and on the sidewalls 34 of the vertical semiconductor stacks 30. An exemplary gate insulator layer 54 is a high-k dielectric material, such as $HfO_2$, HfSiON, or another suitable high-k dielectric material. In an exemplary embodiment, the material forming the gate insulator layer 54 is deposited by chemical vapor deposition (CVD).

As shown in FIG. 18, a gate structure 58 is formed over the gate insulator layer 54. The material for forming the gate structure 58 may be metal, polycrystalline silicon, amorphous silicon, amorphous carbon, or another suitable material. In an exemplary embodiment, the material for forming the gate structure 58 is metal such as tantalum nitride, titanium nitride or other suitable metal gate material. The gate structure 58 may include a layer or layers of material used to tune the work function of the gate structure 58. Such layers are typically formed between the gate insulator layer 54 and the metal gate, e.g., the TaN or TiN. The materials for forming the gate structure 58 may be deposited over the gate insulator layer 54 by CVD, plasma enhanced chemical vapor deposition (PECVD), physical vapor deposition (PVD), or another suitable process. As shown in FIG. 18, the materials for forming the gate structure 58 and the gate insulator layer 54 may be planarized, such as by chemical mechanical planarization (CMP) to the hard mask 20.

Figure 19:
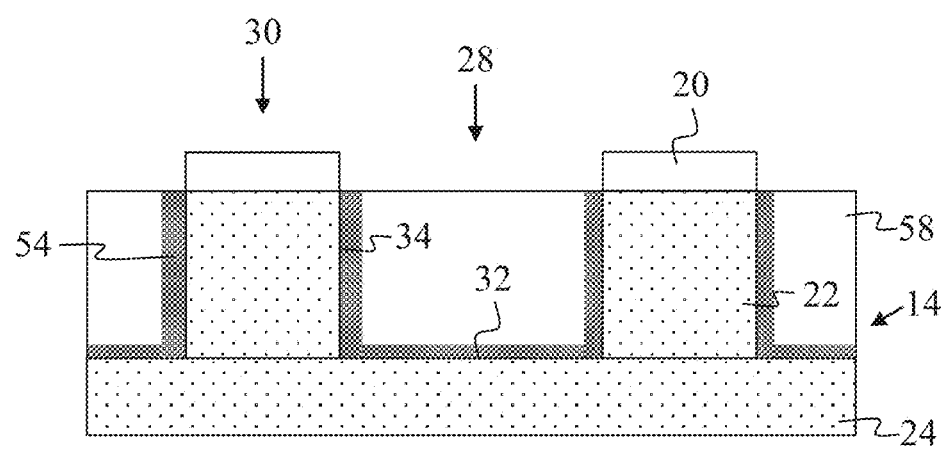

The method may continue in FIG. 19 with a process for recessing the gate structure 58 and the gate insulator 54 within the trench 28. For example, a selective wet etch process may be used to recess the gate structure 58 and the gate insulator 54 to a recessed surface 64. As shown, the etch process is selective to etching the gate structure 58 and the gate insulator 54 over the hard mask 20, which remains substantially unetched.

Figure 20:
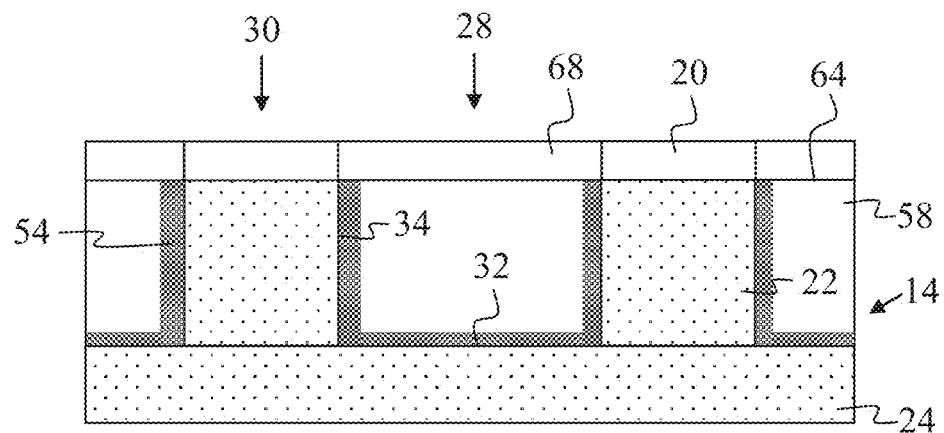

In FIG. 20, a dielectric material 68 is deposited over the recessed surface 64 of the gate structure 58 and the gate insulator 54 and fills the trench 28. As exemplary dielectric material is silicon oxide. In an exemplary embodiment, the dielectric material 68 is blanket deposited by CVD. Then, the partially fabricated integrated circuit 10 is planarized, such as by CMP, to remove portions of the dielectric material 68 outside of the trench 28.

Figure 21:
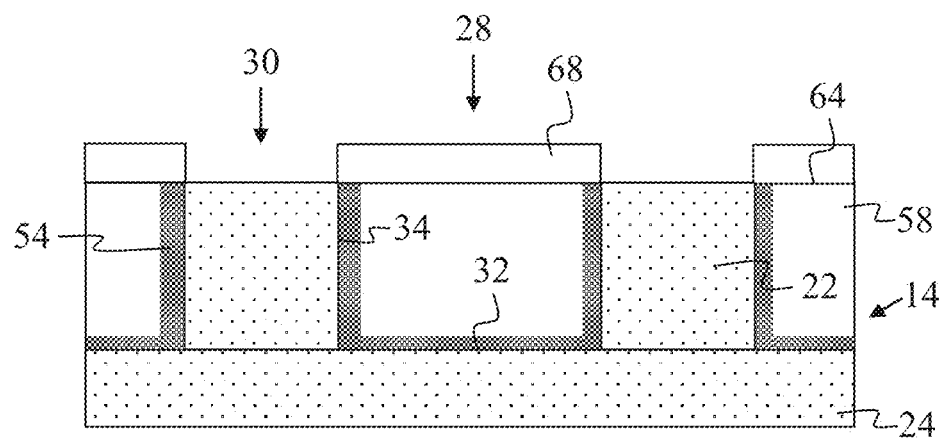
Figure 22:
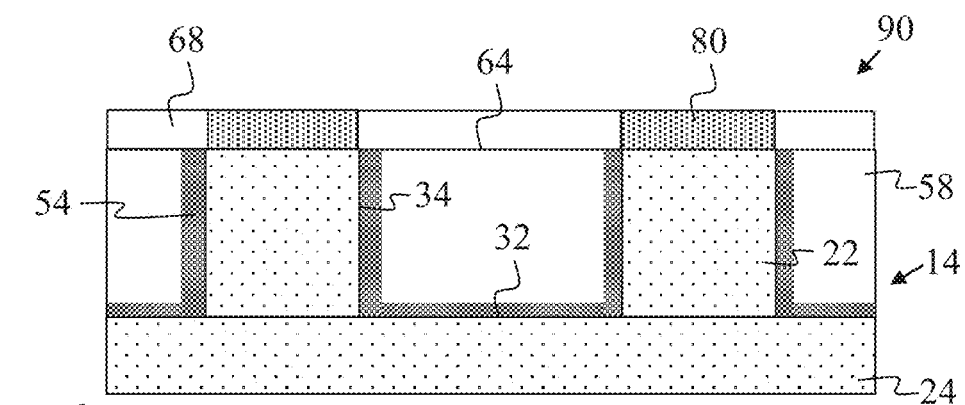

As shown in FIG. 21, the hard mask 20 is removed from the vertical semiconductor stack 30 and the upper portion 22 of the source region 14 is exposed. In an exemplary embodiment, the hard mask 20 is removed by a wet etch process. Then, an upper source/drain region, such as drain region 80, is formed on the upper portion 22 of the source region 14. An exemplary drain region 80 is a highly doped N+ region. In an exemplary embodiment, the drain region 80 is formed by an in situ epitaxial deposition process.

FIGS. 16-22 provide a partially fabricated integrated circuit 10 with a gate structure 58 formed beside a source region 14. The drain region 80 lies above the source region 14, but the gate structure 58 is not formed beside the drain region 80. In the illustrated method, a horizontal interface is formed at surface 32 between the lower portion 24 of the source region 14 and the gate structure 58 and a vertical interface is formed at surface 34 between the upper portion 22 of the source region 14 and the gate structure 58. As a result, horizontal and vertical tunneling paths are provided in the partially fabricated integrated circuit 10 of FIG. 22.

The partially fabricated integrated circuits 10 of FIGS. 9, 15, and/or 22 may undergo further processing such as contact formation through silicidation and back-end-of-line (BEOL) processing to form electrical interconnects for the integrated circuits 10.

The methods and integrated circuits 10 described in FIGS. 1-22 form different embodiments of tunnel transistors 90. Each tunnel transistor includes a gate structure 58 overlying a lower portion 24 of a source region 14 and beside and upper portion 22 of the source region. As a result, each tunnel transistor 90 provides for vertical tunneling from the lower portion 24 of the source region 14 to the gate structure 58 and for horizontal tunneling from the upper portion 22 of the source region 14 to the gate structure 58. As formed, the tunnel transistor provides for higher ON state current and achieves improved subthreshold swing with uniform gate control over a larger tunneling area as compared with known devices. Further, the tunnel transistor described herein allows for lower OFF state leakage, resulting in lower power consumption, as compared to known devices. Also, each tunnel transistor 90 includes a drain region 18 or 80 overlying a source region 14, thereby reducing the transistor footprint.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A method for fabricating an integrated circuit, the method comprising:

etching a semiconductor material to form a fin structure having a horizontal top surface and a vertical side surface formed from the semiconductor material and to form an exposed horizontal surface of the semiconductor material adjacent the vertical side surface of the fin structure;

epitaxially growing a pocket region of semiconductor material on the vertical side surface formed from the semiconductor material and directly on the exposed horizontal surface of the semiconductor material and preventing growth of the pocket region on the top surface of the fin structure with a mask on the top surface of the fin structure; and forming a gate structure adjacent the pocket region, wherein a tunnel transistor is formed by the fin structure, the pocket region and the gate structure.

2. The method of claim 1 further comprising forming a source region and a channel region in the semiconductor material before etching the semiconductor material to form the fin structure.

3. The method of claim 1 further comprising forming a source region, a channel region, and a drain region in the semiconductor material before etching the semiconductor material to form the fin structure.

4. The method of claim 1 further comprising forming a source region doped with a first type of dopant, a channel region, and a drain region doped with a second type of dopant in the semiconductor material before etching the semiconductor material to form the fin structure, wherein epitaxially growing the pocket region of semiconductor material comprises epitaxially growing a pocket region of semiconductor material doped with the second type of dopant.

5. The method of claim 1 further comprising forming a source/drain region in the semiconductor material before etching the semiconductor material to form the fin structure, wherein a portion of the vertical side surface of the fin structure defines a side surface of an upper portion of the source/drain region and wherein a portion of the exposed horizontal surface of the semiconductor material defines an upper surface of a lower portion of the source/drain region.

* * * * *